United States Patent
Katoch

(10) Patent No.: US 9,019,782 B2
(45) Date of Patent: Apr. 28, 2015

(54) DUAL RAIL MEMORY ARCHITECTURE

(75) Inventor: Atul Katoch, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 254 days.

(21) Appl. No.: 13/551,387

(22) Filed: Jul. 17, 2012

(65) Prior Publication Data

US 2013/0135946 A1    May 30, 2013

Related U.S. Application Data

(60) Provisional application No. 61/565,305, filed on Nov. 30, 2011.

(51) Int. Cl.
| | |
|---|---|
| G11C 7/00 | (2006.01) |
| G11C 11/4074 | (2006.01) |
| G11C 11/4091 | (2006.01) |
| G11C 11/4097 | (2006.01) |

(52) U.S. Cl.
CPC ........ *G11C 11/4074* (2013.01); *G11C 11/4091* (2013.01); *G11C 11/4097* (2013.01)

(58) Field of Classification Search
USPC .......... 365/189.11, 189.09, 210, 189.08, 208, 365/207; 257/510; 327/200
See application file for complete search history.

(56) References Cited

U.S. PATENT DOCUMENTS

| | | | |
|---|---|---|---|
| 8,422,326 B2* | 4/2013 | Fujisawa et al. | 365/208 |
| 2003/0042955 A1* | 3/2003 | Nakayama et al. | 327/200 |

* cited by examiner

*Primary Examiner* — Richard Elms
*Assistant Examiner* — Mohammed A Bashar
(74) *Attorney, Agent, or Firm* — Lowe Hauptman & Ham, LLP

(57) ABSTRACT

A memory macro comprises a plurality of memory cells, a plurality of first amplifying circuits, a first driver circuit, and a first level shifter. The plurality of memory cells is arranged in groups of a first direction and groups of a second direction. Each amplifying circuit is coupled to a plurality of first memory cells arranged in a first group of the first direction via a first data line. The first driver circuit is configured to drive the plurality of first amplifying circuits. The first level shifter is configured to level shift an input signal operating in a first power domain to an output signal operating in a second power domain. The output signal of the first level shifter is for use by the first driver circuit. The first driver circuit and a sense amplifier of an amplifying circuit operate in the second power domain.

22 Claims, 3 Drawing Sheets

DUAL RAIL MEMORY ARCHITECTURE

CROSS-REFERENCE TO RELATED APPLICATION

The present application claims priority of U.S. Provisional Patent Application No. 61/565,305, filed on Nov. 30, 2011, which is incorporated herein by reference in its entirety.

FIELD

The present disclosure is related to a dual-rail memory architecture.

BACKGROUND

To improve performance of sense amplifiers, dual electrical power supply is used in some embedded dynamic random access memory (eDRAM). For example, in some approaches, one lower power rail is used to power the input-output circuits (IOs). The other higher power rail is used to power the rest of the circuit in the eDRAM macro. Further, level shifters are placed at the IO boundary of the eDRAM macro to transfer the signals from the lower power domain to the higher power domain. Level shifters, however, are commonly slow, take die area, and consume electrical power. Further, most circuits in the memory macro operate at the higher voltage level provided from the level shifter, which results in high power consumption. Decoupling capacitors are also needed for the high power domain.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
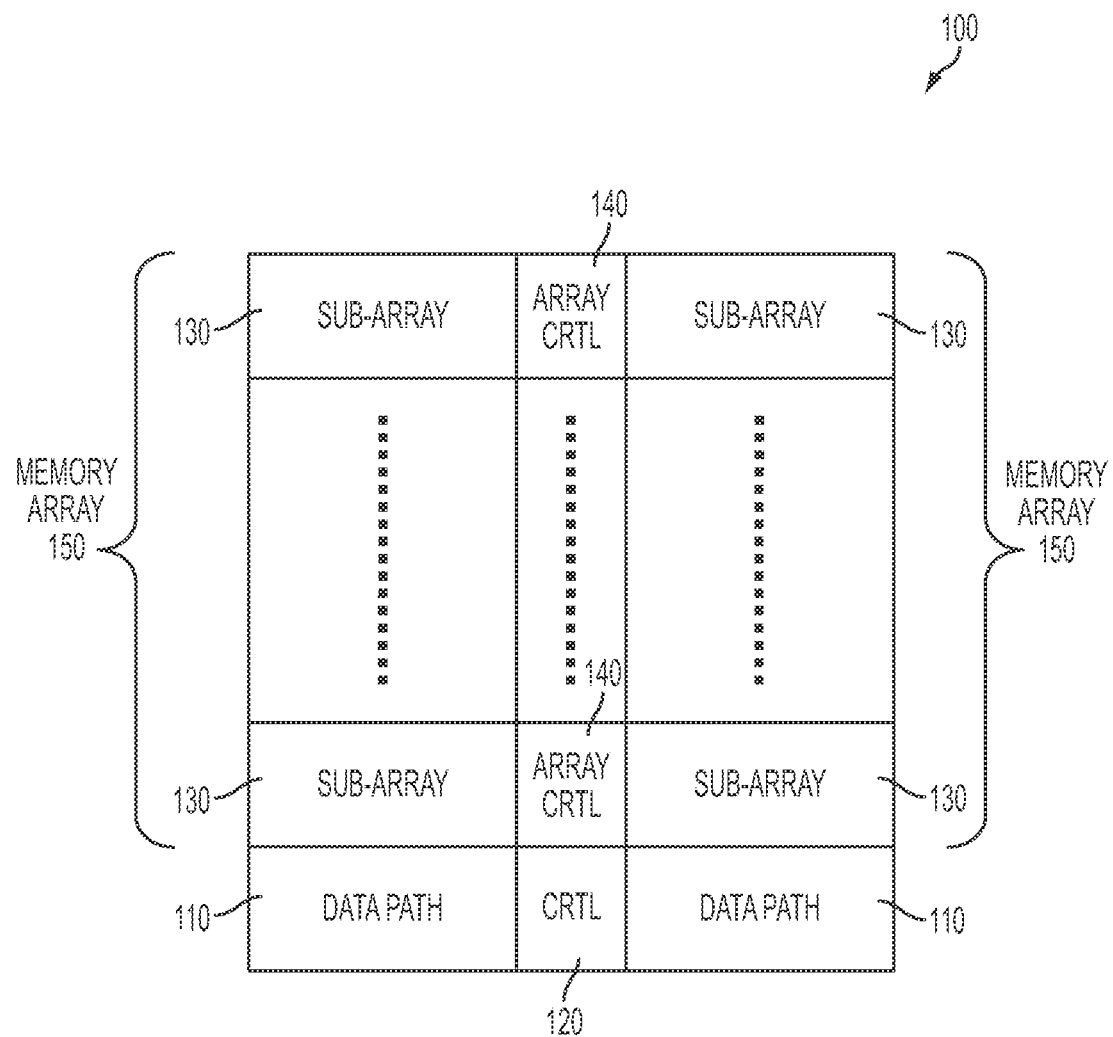
FIG. 1 is a diagram of an embedded dynamic random access memory (eDRAM) macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Most circuits of the memory macro operate at the lower operational voltage level in the VDD power domain. Voltage level shifting for higher voltage level usages is enabled at a local sense amplifying stage. As a result, level shifters commonly found at the IO boundary are no longer needed. The number of level shifters in a memory macro is reduced. The capacitive decoupling required for the high voltage domain is reduced.

Memory Macro

FIG. 1 is a block diagram of a memory macro 100, in accordance with some embodiments. Memory macro 100 is symmetrical. For example, the left side of memory macro 100 has similar elements as the right side of memory macro 100. For illustration, two memory arrays 150 are shown, one on the left side and one on the right side of memory macro 100. Similarly, two data paths 110 are shown, one on the left side and one on the right side. For simplicity, various circuits in each of data path 110, control circuit 120, and array control 140 are not shown.

Control circuit 120 includes the address pre-decode circuits, redundancy control circuits, test related circuits, etc. Control circuit 120 then provides the X-decode, the Y-decode, and the clock signals. Control circuit 120 also interprets the address and command signals to generate control signals to various circuits in memory macro 100.

A data path 110 includes circuitry to transfer data between a corresponding memory sub-array 130 and circuits outside of memory macro 100. For example, in some embodiments, a data path 110 includes circuits to perform write mask operations, circuits to control column redundancy, circuits to encode and decode the error correction code (ECC), sense amplifier circuits for global bit lines, write driver circuits for global bit lines, etc. A data path 110 is also configured to receive the input and output data.

A memory array 150 includes a plurality of memory sub-arrays 130. Details of a memory sub array 130 are explained with reference to FIG. 2.

An array control circuit 140 provides control signals for two sub-arrays 130, for example, for one sub-array 130 on the left side and one sub-array 130 on the right side of memory macro 100. In some embodiments, each array control circuit 140 generates control and timing signals for sense amplifiers used in sensing memory cells in memory array 150. Array control circuit 140 also includes circuits to select banks of memory cells, circuits to decode the word line and word line drivers, etc. Array control circuit 140 further includes sense amplifier drivers 250 and level shifter 260 shown in FIG. 2.

Sub-Circuits of the Memory Macro

Figure 2:
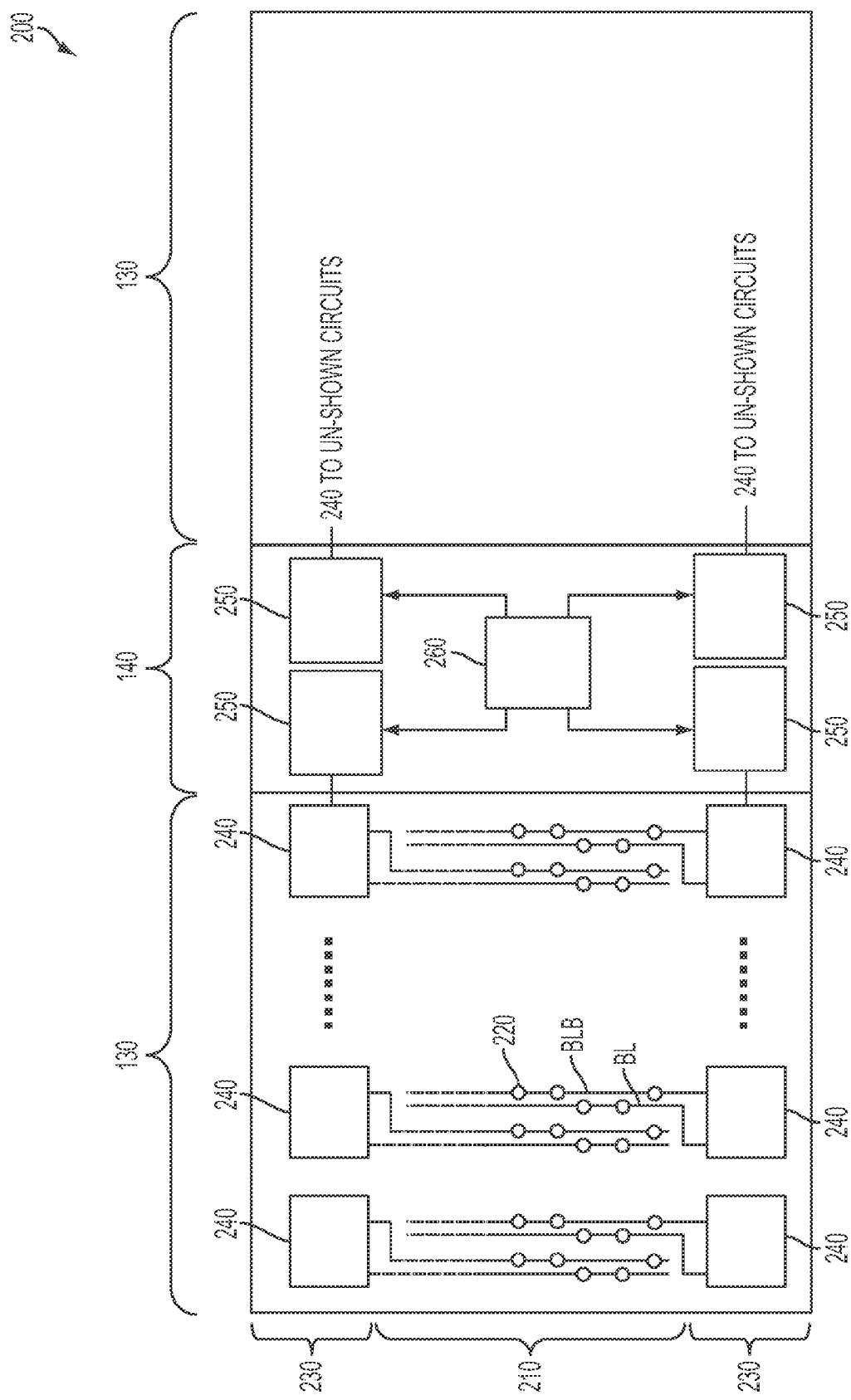
FIG. 2 is a diagram of a portion of the eDRAM macro of FIG. 1, in accordance with some embodiments.

FIG. 2 is a diagram of a circuit 200, which is a portion of memory macro 100, in accordance with some embodiments.

Circuit 200 includes two memory sub-arrays 130 and a memory control circuit 140. For simplicity, details of one memory sub-array 130 are shown, labeled, and described. The details and operation of the other memory sub-array 130 are similar and should be recognizable by persons of ordinary skill in the art.

A memory sub-array 130 includes a memory section 210 and two rows 230 each of which includes a plurality of sense amplifying circuits 240. Each circuit 240 is coupled to a pair of bit lines BL and BLB. Each of a bit line BL and a bit line BLB is coupled to a plurality of memory cell units 220 in a column direction. Effectively, an amplifying circuit 240 is coupled to two columns of memory cell units 220.

Memory section 210 includes a plurality of memory cell units 220. For simplicity, one memory cell unit 220 is labeled. The plurality of memory cell units 220 in memory section 210 are arranged in rows and columns. A column of memory cell units 220 is coupled to a bit line BL or a bit line BLB. A row of memory cell units 220 is coupled to a word line WL illustratively shown in FIG. 3.

Memory array control circuit 140 includes four sense amplifier drivers 250. Each driver 250 is coupled to a corresponding row of sense amplifying circuits 240.

A level shifter 260 is used to level shift the signals of a driver 250. As illustratively shown in FIG. 2, a level shifter 260 is used for four drivers 250. In some other embodiments, each driver 250 is associated with one level shifter. Embodiments of the disclosures are not limited the number of level shifters associated with a driver 250. One or a plurality of level shifters associated with one or a plurality of drivers 250 is within the scope of various embodiments.

Memory Circuit

Figure 3:
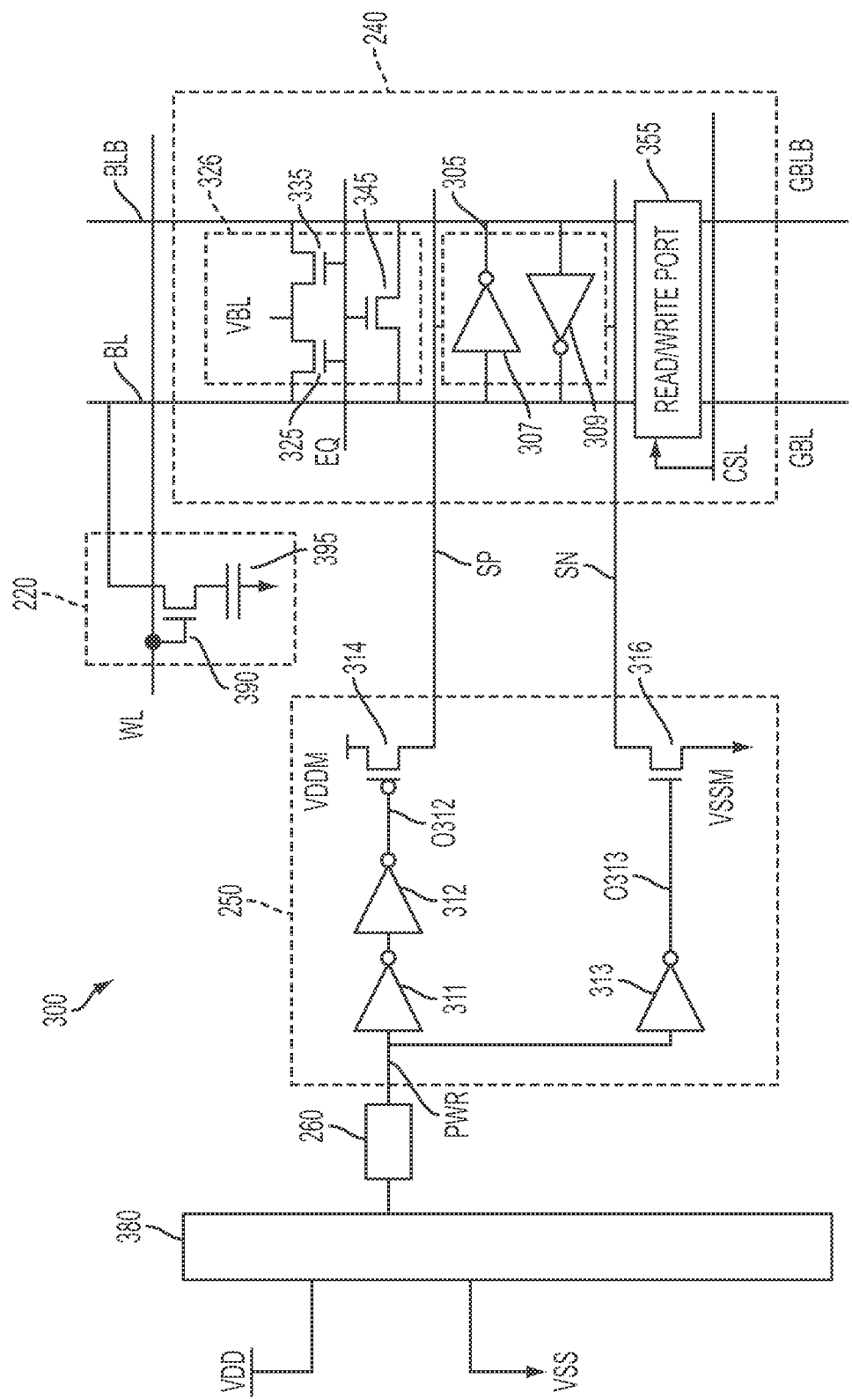
FIG. 3 is a diagram of a circuit illustrating operations of a memory cell of the eDRAM macro in FIG. 1, in accordance with some embodiments.

FIG. 3 is a diagram of a memory circuit 300, in accordance with some embodiments.

Memory circuit 300 uses a VDD power domain and a VDDM power domain. For example, circuit 380 is shown using the VDD power domain because the sub-circuits (not shown) in circuit 380 use operational voltage VDD and reference voltage VSS. In contrast, level shifter 260, driver 250, and sense amplifier 305 use the VDDM power domain. For example, as illustratively shown in driver 250, the sources of PMOS transistor 314 and of NMOS transistor 316 use operational voltage VDDM and reference voltage VSSM, respectively. As a result, signals SP and SN, when at a full voltage swing, have voltages VDDM and VSSM, respectively.

In a VDD power domain, the operational voltage and reference voltage for devices such as transistors are voltages VDD and VSS, respectively. Further, the voltage levels for electrical signals are adapted to the voltage levels of voltage VDD and voltage VSS. For example, a high logical voltage level and a low logical voltage level in the VDD power domain is operational voltage VDD and reference voltage VSS, respectively.

In contrast, in a VDDM power domain, the operational voltage and reference voltage for electrical devices are voltage VDDM and voltage VSSM, respectively. Further, the voltage levels for electrical signals are adapted to the voltage levels of voltage VDDM and voltage VSSM. For example, a high logical voltage level and a low logical voltage level in the VDDM power domain are voltage VDDM and voltage VSSM, respectively. In some embodiments, voltage VDDM is about 1.2 V, which is higher than voltage VDD of about 0.85 V. Further, voltage VSSM is −100 mV, which is lower than voltage VSS of ground or 0 V.

In some embodiments, sense amplifier 305 using the VDDM power domain provides the VDDM and VSSM voltage levels on bit line BL and BLB. Memory unit 220, pre-charge and equalization circuit 326, and read-write port 355, by nature of their designs and operations, are able to handle the voltage levels VDDM and VSSM provided by sense amplifier 305. For example, each transistor in memory unit 220, pre-charge and equalization circuit 326, and read-write port 355 is designed such that the absolute value of the voltage dropped across the gate and the source of each transistor is less than or equal to voltage VDDM. For another example, to pre-charge and equalize bit lines BL and BLB, signal EQ is applied with a voltage value that is in between voltage VDDM and voltage VPP, and is 1.2V, in some embodiments. Transistors 325, 335, and 345 are therefore able to handle the voltage swing of voltage VDDM and voltage VSSM. Transistor 390, capacitor 395, read-write port 355, and global bit lines GBL and GBLB are also able handle the voltage levels VDDM and VSSM on bit lines BL and BLB.

In FIG. 3, both voltage levels VDDM and VSSM are used in the VDDM power domain for illustration. In various embodiments, the VDDM power domain includes either one of voltage VDDM or voltage VSSM. For example, in some embodiments, a high logical voltage level and a low logical voltage level in the VDDM domain uses voltage VDDM and voltage VSS, respectively. In some other embodiments, a high logical voltage level and a low logical voltage level in the VDDM domain uses voltage VDD and voltage VSSM, respectively.

Column select signal CSL and read-write port 355 enable the data transfer between the pair of local bit lines BL and BLB and the pair of global bit lines GBL and GBLB, respectively.

Pre-charge and equalization (PCEQ) circuit 326 includes transistors 325, 335, and 345 that, together with signal EQ, are used to pre-charge and equalize bit lines BL and BLB. For example, when signal EQ is applied with a high logical value, transistors 325, 335, and 345 are turned on, enabling bit lines BL and BLB to be at the same voltage level VBL at the drains of transistors 325 and 335. Stated differently, bit lines BL and BLB are pre-charged and equalized to voltage VBL. The term "pre-charge" is commonly used to refer to charging before reading and/or writing a memory cell 395. A circuit similar to circuit 326 is used to pre-charge and equalize signals SP and SN. For simplicity, however, the circuit is not shown, and should be recognizable by persons of ordinary skill in the art.

Memory cell unit 220 includes a pass gate transistor 390 and a memory cell 395. Transistor 390 allows access between local sense amplifier 305 and memory cell 395 through the pair of bit lines BL and BLB. In some embodiments, each of bit lines BL and BLB is connected to an equal number of memory cell units 220, but only one memory cell unit 220 connected to bit line BL is shown in FIG. 3 for illustration. In some embodiments, memory cell 395 is a capacitor storing charges. When memory cell 395 is electrically connected to a bit line BL as shown in FIG. 3, memory cell 395 shares the same charge with bit line BL. Depending on the charge representing the logical value of memory cell 395, bit line BL is pulled one way or another. For example, if memory cell 395 stores a logical low value, bit line BL is pulled towards ground or reference voltage VSSM. Conversely, if memory cell 395 stores a high logical value, bit line BL is pulled towards operational voltage VDDM. After memory cell 395 and bit line BL are electrically coupled together, a bit line split or the voltage difference between bit line BL and bit line BLB starts to develop.

Bit lines BL and BLB serve as both data input and output for memory cell 395 and for sense amplifier 305. In some embodiments, in a write cycle, applying a logical value to a first bit line, and the opposite logical value to the other bit line, enables writing the logical value at the first bit line to memory cell 395. In a read cycle, sensing or reading the logical values at bit lines BL and BLB reveals the data stored in memory cell 395. For example, once the bit line split is sufficiently large, sense amplifier 305 amplifies the bit line split, providing a full swing signal on bit lines BL and BLB that represents the data to be read from memory cell 395. For another example, if memory cell 395 stores a logical high value, sensing bit line BL reveals a high logical value. Conversely, if memory cell 395 stores a logical low value, sensing bit line BL reveals a logical low value. In some embodiments, a logical low value for a full swing signal is at reference voltage VSS while a logical high value for a full swing signal is at operational voltage VDDM.

Word line WL is used to turn on or off memory pass gate transistor 390 to allow access to memory cell 395 through transistor 390. In FIG. 3, memory cell unit 220 is electrically coupled to bit line BL for illustration. Depending on implementations in a memory array, some memory cell units 220 are connected to bit line BL while some other memory cell units 220 are connected to bit line BLB. In FIG. 3, when word line WL at the gate of transistor 390 is applied with a logical low value, transistor 390 is turned off. The corresponding memory cell 395 is therefore electrically disconnected from bit line BL or from sense amplifier 305. When word line WL is applied with a logical high value, however, transistor 390 is turned on. The corresponding memory cell 395 is electrically connected to bit line BL. In some embodiments, the high logical value of word line WL is 1.5 V. Transistor 390 is adapted to support the high voltage level of word line WL, and is therefore able to support the voltage levels VDDM and VSSM on bit line BL.

Local sense amplifier 305 includes a cross-coupled, or sensing, pair 307 and 309. When a bit line split of bit lines BL and BLB is sufficiently developed, sense amplifier 305 is turned on for the sensing pair to sense or amplify the bit line split and generate a full swing signal on local bit lines BL and BLB that represent the data read from memory cell 395. In some embodiments, after sensing, sense amplifier 305 also restores the read data to memory cell 395, and sends the data on bit lines BL and BLB to the corresponding global bit lines GBL and GBLB. In some embodiments, sense amplifier 305 is turned on when the bit line split reaches a predetermined voltage value, which varies depending on various factors, such as the technology node, the ability of sense amplifier 305 to sense or differentiate the voltage levels of bit lines BL and BLB, etc. In some embodiments, sense amplifier 305 is able to sense when the bit line split, or the difference in the voltage levels of bit lines BL and BLB, reaches a sensing threshold, which, for illustration, is called amplifying threshold voltage Vsense.

Signals SP and SN are used to turn on or off sense amplifier 305. Signal SP is called the positive supply voltage while signal SN is called the negative supply voltage, even though signal SN has a positive voltage in many situations. In general, when signals SP and SN are at a same voltage level, amplifier 305 is turned off. In some embodiments, both signals SP and SN are set at half of voltage VDDM-VSSM to turn off sense amplifier 305. In contrast, when signal SP is at an operational voltage VDDM and signal SN is at a reference voltage level VSSM, sense amplifier 305 is turned on.

Circuit 380 is shown to illustrate a circuit using a VDD power domain. In some embodiments, circuits considered as part of circuit 380 that use a VDD power domain include data paths 110, control circuits 120, and various circuitries in array control circuits 140, such as circuits used to select a bank of memory cells, circuits used to decode the word lines and word line drivers, circuits used to produce control and timing signals for the sense amplifiers, etc.

Level shifter 260 level shifts the voltage levels for use in the VDD power domain of circuit 380 to the voltage levels for use in the VDDM power domain that includes driver circuit 250 and sense amplifier 305. For example, a high voltage level of the input signal of level shifter 260 is voltage VDD while the high voltage level of the output signal PWR of level shifter 260 is voltage VDDM. Similarly, a low voltage value of the input of level shifter 260 is voltage VSS while the low voltage level of the output signal PWR of level shifter 260 is voltage VSSM.

Sense amplifying driver 250 serves as means to provide the operational voltage value VDDM and reference voltage VSSM to signals SP and SN, respectively. For example, signal PWR at the input of inverter 311 passes through inverters 311 and 312. When signal PWR is logically low, signal O312 at the output of inverter 312 is therefore logically low. As a result, PMOS transistor 314 is turned on, and signal SP at the drain of transistor 314 is pulled to voltage VDDM at the source of transistor 314. At the same time, signal PWR also passes through inverter 313, resulting in signal O313 at the output of inverter 313 being high. Signal O313 is also at the gate of NMOS transistor 316. As a result, NMOS transistor 316 is turned on, and signal SN at the drain of transistor 316 is pulled to voltage VSSM at the source of transistor 316. Because signal SP is at voltage VDDM and signal SN is at voltage VSSM, amplifier 305 is turned on. In contrast, when signal PWR is logically high, signal O312 is logically high, and signal O313 is logically low. As a result, both transistors 314 and 316 are turned off, electrically disconnecting voltage VDDM and VSSM from the respective signals SP and SN. Sense amplifier 305 is therefore turned off. In some embodiments, when signals SP and SN are at the same voltage level, such as half of voltage (VDDM-VSSM), sense amplifier 305 is also turned off. In some embodiments, signals SP and SN are pre-charged and equalized to a same voltage VBL before reading or writing.

In FIG. 3, one sense amplifying circuit 240 is shown for illustration. In some embodiments, one driver 250 is used for a plurality of amplifying circuits 240 in a row as illustratively shown in FIG. 2.

Various embodiments are advantageous because the total number of circuits that use voltages VDDM and VSSM in the VDDM power domain in memory macro 100 is reduced. Further, various other circuits that are currently used do not need modifications to adapt to the new circuits that use the VDDM power domain. For example, in FIG. 3, level shifter 260, driver 250, and amplifier 305 use the VDDM power domain. In some embodiments, memory units 220, PCEQ circuit 326, read write port 355, and global bit lines GBL and GBLB have been implemented for use in different versions of memory macro 100. Memory units 220, PCEQ circuit 326, read-write port 355, and global bit lines GBL and GBLB, however, are able to handle the voltage levels VDDM and VSSM in bit lines BL and BLB that are generated by sense amplifier 305. In other words, even though the VDDM power domain is designed for driver 250 to drive amplifier 305, no circuit modification needs to be done for memory units 220, PCEQ circuit 326, read write port 355, and global bit lines GBL and GBLB, in accordance with some embodiments.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level of various signals used in the above description is also for illustration purposes. Various embodiments are not limited to a particular level when a signal is activated and/or deactivated. Selecting different levels is within the scope of various embodiments.

In various embodiments, a transistor functions as a switch. A switching circuit used in place of a transistor is within the scope of various embodiments.

In some embodiments, a memory macro comprises a plurality of memory cell units, a plurality of first amplifying circuits, a first driver circuit, and a first level shifter. The plurality of memory cell units is arranged in groups of a first direction and groups of a second direction. Each amplifying circuit is coupled to a plurality of first memory cell units arranged in a first group of the first direction via a first data line. The first driver circuit is configured to drive the plurality of first amplifying circuits. The first level shifter is configured to level shift an input signal operating in a first power domain to an output signal operating in a second power domain. The output signal of the first level shifter is for use by the first driver circuit. The first driver circuit and a sense amplifier of an amplifying circuit of the plurality of first amplifying circuits operate in the second power domain.

In some embodiments, a memory macro comprises a plurality of memory cell units, at least one level shifter, a first driver circuit, and a plurality of sense amplifiers. The plurality of memory cell units is arranged in groups of a first direction and groups of a second direction. A level shifter of the at least one level shifter is configured to receive an input signal in a first power domain and provide an output signal in a second power domain. The first driver circuit is configured to receive the output signal of the level shifter and provide a first power supply signal to the plurality of sense amplifiers. A voltage level of the first power supply signal is of a second power domain. Each sense amplifier of the plurality of sense amplifiers is coupled to a pair of data lines. Each data line of the pair of data lines is electrically coupled to a corresponding plurality of memory cell units. A voltage level of a data line of the pair of data lines includes a voltage level of the second power supply domain.

In some embodiments, a memory macro comprises a control unit and a first memory sub-array. The first memory sub-array includes a plurality of first memory cell units and a plurality of first sense amplifying circuits. The first memory cell units are arranged in groups of a first direction and groups of a second direction. The plurality of first sense amplifying circuits is arranged in a first group of the second direction. The array control circuit includes a first driver circuit. The control circuit is configured to operate in a first power domain. The first driver circuit is configured to drive the plurality of first sense amplifying circuits. Each sense amplifying circuit of the plurality of first sense amplifying circuits includes a first sense amplifier configured to operate in the second power domain.

What is claimed is:

1. A memory macro comprising:
   a plurality of memory cell units arranged in groups of a first direction and groups of a second direction;
   a plurality of first amplifying circuits, wherein each amplifying circuit of the plurality of first amplifying circuits is coupled to a plurality of first memory cell units arranged in a first group of the first direction via a first data line;
   a first driver circuit configured to drive the plurality of first amplifying circuits;
   a first level shifter configured to level shift an input signal operating in a first power domain to an output signal operating in a second power domain; and
   a control circuit configured to generate timing and control signals, the timing and control signals comprising the input signal for the first level shifter,
   wherein
       the output signal of the first level shifter is for use by the first driver circuit;
       the first driver circuit and a sense amplifier of an amplifying circuit of the plurality of first amplifying circuits are configured to operate in the second power domain;
       the first data line has a voltage value of the second power domain provided by the sense amplifier; and
       the control circuit is configured to operate in the first power domain.

2. The memory macro of claim 1, wherein
the memory macro further comprises a plurality of second amplifying circuits and a second driver circuit;
each amplifying circuit of the plurality of second amplifying circuits is coupled to a plurality of second memory cell units arranged in a second group of the first direction via a second data line;
the second driver circuit is configured to drive the plurality of second amplifying circuits; and
the plurality of first amplifying circuits and the plurality of second amplifying circuits are part of a memory sub-array of a memory array of the memory macro.

3. The memory macro of claim 1, wherein
the memory macro further comprises a plurality of second amplifying circuits and a second driver circuit;
each amplifying circuit of the plurality of second amplifying circuits is coupled to a plurality of second memory cell units arranged in a second group of the first direction via a second data line;
the second driver circuit is configured to drive the plurality of second amplifying circuits; and
the first level shifter is for use by the second driver circuit.

4. The memory macro of claim 1, wherein
the memory macro further comprises a plurality of second amplifying circuits, a second driver circuit, and a second level shifter;
each amplifying circuit of the plurality of second amplifying circuits is coupled to a plurality of second memory cell units arranged in a second group of the first direction via a second data line;
the second driver circuit is configured to drive the plurality of second amplifying circuits; and
the second level shifter is for use by the second driver circuit.

5. The memory macro of claim 1, wherein
each amplifying circuit of the plurality of first amplifying circuits is further coupled to a plurality of second memory cell units arranged in a second group of the first direction via a second data line.

6. The memory macro of claim 1, wherein
the first driver circuit includes a first transistor configured to provide a first supply voltage value to a first power supply line of the sense amplifier;
the first driver circuit includes a second transistor configured to provide a second supply voltage value to a second power supply line of the sense amplifier; and
at least one of the first voltage value or the second voltage value is a voltage level of the second power domain.

7. The memory macro of claim 6, wherein
a drain of the first transistor is configured to carry the first power supply line of the sense amplifier;
a source of the first transistor is configured to provide the first supply voltage value;
a gate of the first transistor is driven by a first signal affected by the first level shifter;
a drain of the second transistor is configured to carry the second power supply line of the sense amplifier;
a source of the second transistor is configured to provide the second supply voltage value; and
a gate of the second transistor is driven by a second signal affected by the first level shifter.

8. A memory macro comprising:
a plurality of memory cell units arranged in groups of a first direction and groups of a second direction;
at least one level shifter;
a first driver circuit;
a plurality of first sense amplifiers; and
a control circuit,
wherein
 a level shifter of the at least one level shifter is configured to receive an input signal in a first power domain and provide an output signal in a second power domain;
 the first driver circuit is configured to receive the output signal of the level shifter and provide a first power supply signal to the plurality of sense amplifiers;
 a voltage level of the first power supply signal is of the second power domain;
 each sense amplifier of the plurality of sense amplifiers is coupled to a pair of data lines;
 each data line of the pair of data lines is electrically coupled to a corresponding plurality of memory cell units;
 a voltage level of a data line of the pair of data lines includes a voltage level of the second power supply domain;
 the control circuit is configured to generate control and timing signals, the control and timing signals comprising the input signal for the first level shifter; and
 the control circuit is configured to operate in the first power domain.

9. The memory macro of claim 8, wherein
the first driver circuit includes a transistor;
the output signal of the level shifter is configured to control a gate of the transistor; and
a drain of the transistor is configured to carry the first power supply signal.

10. The memory macro of claim 8, wherein
the memory macro further includes a plurality of second sense amplifiers and a second driver circuit;
the at least one level shifter is configured for use by the first driver circuit and the second driver circuit;
the plurality of first sense amplifiers belong to a first memory sub-array of the memory macro; and
the plurality of second sense amplifiers belongs to the first memory sub-array or a second memory sub-array different from the first memory sub-array.

11. The memory macro of claim 8, wherein
the each sense amplifier of the plurality of sense amplifiers is further coupled to a pre-charge and equalization circuit and a read-write port; and
the pre-charge and equalization circuit and the read-write port are configured to adapt to the voltage level of the data line of the pair of data lines that includes the voltage level of the second power supply domain.

12. A memory macro comprising:
a control circuit
a first memory sub-array including
 a plurality of first memory cell units arranged in groups of a first direction and groups of a second direction;
 a plurality of first sense amplifying circuits arranged in a first group of the second direction
an array control circuit including
 a first driver circuit,
wherein
 the control circuit is configured to operate in a first power domain;
 the first driver circuit is configured to drive the plurality of first sense amplifying circuits;
 each sense amplifying circuit of the plurality of first sense amplifying circuits includes a first sense amplifier configured to operate in the second power domain.

13. The memory macro of claim 12, wherein
the memory macro further includes a plurality of second sense amplifying circuits arranged in a second group of the second direction;
the array control circuit further includes a second driver circuit;
the second driver circuit is configured to drive the plurality of second sense amplifying circuits; and
each sense amplifying circuit of the plurality of second sense amplifying circuits includes a second sense amplifier configured to operate in the second power domain.

14. The memory macro of claim 13, wherein
the plurality of second sense amplifying circuits belongs to the first memory sub-array; or
the plurality of second sense amplifying circuits belongs to a second memory sub-array different from the first memory sub-array.

15. The memory macro of claim 13, wherein
the memory macro further includes at least one level shifter circuit configured for use by the first driver circuit and the second driver circuit; and
a level shifter circuit of the at least one level shifter circuit is configured to level shift an input signal in the first power domain to an output signal in the second power domain.

16. The memory macro of claim 12, wherein
the memory macro further includes a level shifter configured to level shift an input signal in the first power domain to an output signal in the second power domain;
the first driver circuit is configured to receive the output signal and, based on the output signal, generate a power supply signal having a voltage level in the second power domain for use by the first sense amplifier.

17. The memory macro of claim 16, wherein
the first driver circuit includes a transistor having a drain, a source, and a gate;
the gate is driven based on the output signal;
the source is configured to receive a signal having the voltage level in the second power domain; and
the drain is configured to provide the power supply signal based on the signal received at the source of the transistor.

18. The memory macro of claim 12, wherein
the first sense amplifier is coupled to a pair of data lines;
a data line of the pair of data line is coupled to a plurality of memory cell units; and
a voltage level of the data line of the pair of the data lines is configured to have a voltage level of the second power domain.

19. The memory macro of claim 18, wherein
the memory macro further includes a pre-charge and equalization circuit and a read-write port;
the pre-charge and equalization circuit and the read-write port are coupled to the pair of data lines and configured to adapt to the voltage level of the data line of the pair of data lines that has the voltage level of the second power domain.

20. The memory macro of claim 1, wherein a voltage swing of the second power domain is greater than a voltage swing of the first power domain.

21. The memory macro of claim 8, wherein a voltage swing of the second power domain is greater than a voltage swing of the first power domain.

22. The memory macro claim 12, wherein a voltage swing of the second power domain is greater than a voltage swing of the first power domain.

\* \* \* \* \*